United States Patent
Lee et al.

(10) Patent No.: US 9,633,743 B2
(45) Date of Patent: Apr. 25, 2017

(54) METHOD OF SHAPING A STROBE SIGNAL, A DATA STORAGE SYSTEM AND STROBE SIGNAL SHAPING DEVICE

(71) Applicant: SAMSUNG ELECTRONICS CO., LTD., Suwon-si, Gyeonggi-do (KR)

(72) Inventors: Jangwoo Lee, Hwaseong-si (KR); Kyoungtae Kang, Seoul (KR); Taesung Lee, Hwaseong-si (KR); Jeongdon Ihm, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/600,353

(22) Filed: Jan. 20, 2015

(65) Prior Publication Data

US 2015/0294730 A1 Oct. 15, 2015

(30) Foreign Application Priority Data

Apr. 14, 2014 (KR) .................. 10-2014-0044332

(51) Int. Cl.
| | | |
|---|---|---|
| *G11C 16/04* | (2006.01) | |
| *G11C 16/32* | (2006.01) | |
| *G11C 16/30* | (2006.01) | |

(52) U.S. Cl.
CPC .............. *G11C 16/32* (2013.01); *G11C 16/30* (2013.01)

(58) Field of Classification Search
USPC ........................................................ 365/193
See application file for complete search history.

(56) References Cited

U.S. PATENT DOCUMENTS

| | | | |
|---|---|---|---|
| 5,258,956 A * | 11/1993 | Ahn | ..................... G11C 11/4091 327/530 |
| 6,333,875 B1 | 12/2001 | Shinozaki | |
| 6,349,072 B1 | 2/2002 | Origasa et al. | |
| 7,075,856 B2 | 7/2006 | Labrum et al. | |
| 7,117,381 B2 | 10/2006 | Kim et al. | |
| 8,120,953 B2 | 2/2012 | Tanaka | |
| 8,199,607 B2 | 6/2012 | Shin | |
| 8,242,821 B2 | 8/2012 | Bae et al. | |
| 8,432,193 B2 | 4/2013 | Marutani | |
| 8,605,825 B2 | 12/2013 | Washizu | |
| 2001/0046163 A1* | 11/2001 | Yanagawa | ........... G06F 13/1689 365/194 |
| 2010/0060323 A1 | 3/2010 | Sumi | |
| 2012/0194251 A1* | 8/2012 | Washizu | .......... G01R 31/31727 327/298 |
| 2015/0206824 A1* | 7/2015 | Ramachandra | .......... G11C 8/12 365/185.23 |

FOREIGN PATENT DOCUMENTS

| | | |
|---|---|---|
| JP | 4024972 B2 | 10/2007 |
| JP | 2012080343 A | 4/2012 |
| JP | 5191218 B2 | 2/2013 |
| JP | 5211239 B2 | 6/2013 |

* cited by examiner

*Primary Examiner* — Son Dinh
*Assistant Examiner* — Uyen B Tran
(74) *Attorney, Agent, or Firm* — Volentine & Whitt, PLLC

(57) ABSTRACT

A strobe signal shaping method for a data storage system includes receiving a strobe signal; boosting a first clock edge portion of the strobe signal when the strobe signal is received after having been idle or paused over a predetermined time period; and returning to an operating mode in which boosting is turned off with respect to a second clock edge portion of the strobe signal.

18 Claims, 13 Drawing Sheets

METHOD OF SHAPING A STROBE SIGNAL, A DATA STORAGE SYSTEM AND STROBE SIGNAL SHAPING DEVICE

CROSS-REFERENCE TO RELATED APPLICATIONS

A claim for priority under 35 U.S.C. §119 is made to Korean Patent Application No. 10-2014-0044332 filed Apr. 14, 2014, in the Korean Intellectual Property Office, the entire contents of which are hereby incorporated by reference.

BACKGROUND

The inventive concepts described herein relate to a data storage system, and more particularly, relate to a method of shaping a strobe signal of a data storage system, and a strobe signal shaping device.

A data storage system such as a solid state drive (SSD) or an embedded MMC (eMMC) may connect with a host to store data from the host in its memory device or export data stored in the memory device to the host.

The memory device, which the data storage system includes, may be a nonvolatile semiconductor memory, such as a flash memory. In such a case, during a read operation mode, the memory device may generate a read enable clock based on a strobe signal that a controller sends to it.

In a data storage system that produces a read enable clock using a strobe signal, a first clock edge of the strobe signal may be distorted due to frequency characteristics of a transmission channel and the memory device. A first clock edge of a strobe signal applied after an idle period may suffer the most influence of ISI (Inter Symbol Interference). The read enable clock may be distorted when a receiving quality of the strobe signal decreases, thereby degrading performance of a data read operation.

SUMMARY

One aspect of embodiments of the inventive concept is directed to provide a strobe signal shaping method of a data storage system which comprises: receiving at a memory device a strobe signal; when the strobe signal is received after having been paused for more than a predetermined time period, boosting a first clock edge portion of the strobe signal which is received after the predetermined time period wherein the strobe signal was paused; and subsequent to boosting the first edge portion of the strobe signal, returning to an operating mode in which a second clock edge portion of the strobe signal which follows the first edge portion of the strobe signal is not boosted.

In exemplary embodiments, the strobe signal is used as a source signal for generating a read enable clock of the memory device.

In exemplary embodiments, the first clock edge portion of the strobe signal is boosted by lowering a common-mode voltage level of an output node of a buffer to be less than a common-mode voltage level in the operating mode in which the second clock edge portion of the strobe signal which follows the first edge portion of the strobe signal is not boosted.

In exemplary embodiments, boosting the first clock edge portion of the strobe signal.

In exemplary embodiments, returning to an operating mode in which a second clock edge portion of the strobe signal which follows the first edge portion of the strobe signal is not boosted is accomplished by increasing a common-mode voltage level of an output node of a buffer above a common-mode voltage level during the boosting.

In exemplary embodiments, the buffer is an input buffer of the memory device, for example a nonvolatile semiconductor memory device.

In exemplary embodiments, the nonvolatile semiconductor memory device is a flash memory device.

In exemplary embodiments, the flash memory device is of a multi-stage stack type.

In exemplary embodiments, the flash memory device is included in a solid state drive.

In exemplary embodiments, the flash memory device is used in an embedded MultiMediaCard (MMC).

In exemplary embodiments, the strobe signal is received from a memory controller in a data read mode of operation.

Another aspect of embodiments of the inventive concept is directed to provide a strobe signal shaping circuit of a data storage system which comprises a buffer adapted to receive a strobe signal; and a boosting circuit, wherein if the strobe signal is received after having been paused for more than a predetermined time period, then in response to a boosting enable signal the boosting circuit boosts a first clock edge portion of the strobe signal which is received after the predetermined time period wherein the strobe signal was paused, and turns off boosting for a second clock edge portion of the strobe signal which follows the first clock edge portion.

In exemplary embodiments, when boosting the first clock edge portion of the strobe signal the boosting circuit makes a common-mode voltage level of an output node of the buffer to be less than a common-mode voltage level when not boosting the second clock edge portion of the strobe signal.

In exemplary embodiments, when boosting the first clock edge portion of the strobe signal the boosting circuit makes a common-mode voltage level of an output node of the buffer to be less than a common-mode voltage level when not boosting the second clock edge portion of the strobe signal, such that a duty ratio of the first clock edge portion of the strobe signal exceeds 50%.

In exemplary embodiments, the boosting circuit generates a read enable clock of a nonvolatile semiconductor memory device using the strobe signal.

Yet another aspect of embodiments of the inventive concept is directed to providing a method comprising: receiving at a memory device a strobe signal for reading data from the memory device; processing the received strobe signal to produce a read enable clock for the memory device; and outputting the read enable clock to read data stored in a memory cell array of the memory device. The processing includes: when the received strobe signal is received after having been idle for an idle period which more than a predetermined time period, extending a time length of a first portion of the received strobe signal to produce a corresponding first portion of the read enable clock, wherein the first portion of the received strobe signal extends from a first clock edge of the strobe signal which is received after the idle period to an immediately subsequent clock edge of the received strobe signal, and producing a second portion of the read enable clock by not extending a time length of a corresponding second portion of the received strobe signal, wherein the second portion of the received strobe signal extends from a second clock edge of the strobe signal which is received after the first clock edge of the strobe signal to a next clock edge of the received strobe signal which is received after the second clock edge.

In exemplary embodiments, the second clock edge of the received strobe signal is the immediately subsequent clock edge of the strobe signal which follows the first clock edge.

In exemplary embodiments, the second clock edge of the received strobe signal is a clock edge which is received after the immediately subsequent clock edge of the strobe signal which follows the first clock edge.

In exemplary embodiments, a ratio of the time length of the first portion of the received strobe signal to the time length of the second portion of the received strobe signal is less than 50:50, and a ratio of a time length of the first portion of the read enable clock to a time length of the second portion of the read enable clock is at least 50:50.

In exemplary embodiments, the processing further comprises when the received strobe signal is received after a time period which is less than the predetermined time period, not extending the time length of the first portion of the received strobe signal.

BRIEF DESCRIPTION OF THE FIGURES

The above and other objects and features will become apparent from the following description with reference to the following figures, wherein like reference numerals refer to like parts throughout the various figures unless otherwise specified.

DETAILED DESCRIPTION

Figure 1:
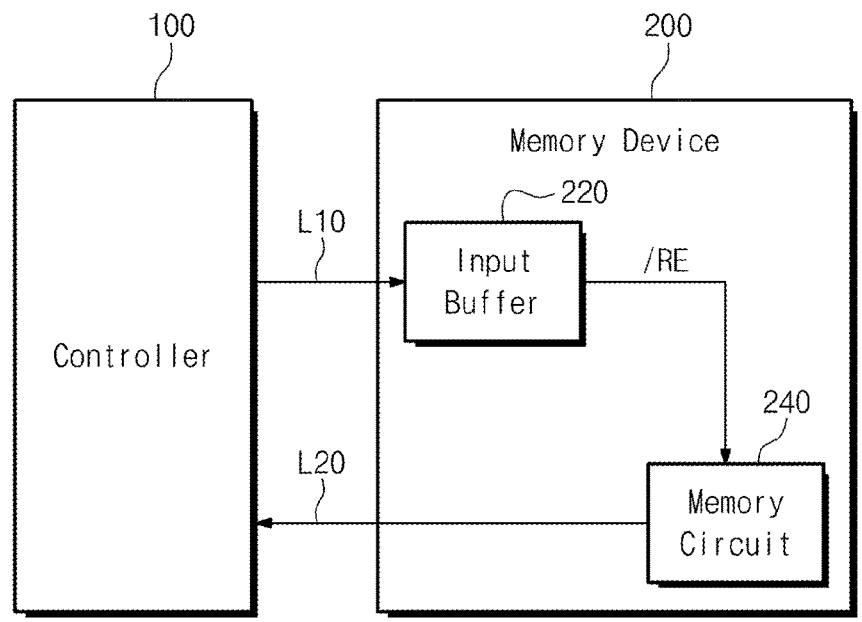
FIG. 1 is a block diagram schematically illustrating an example embodiment of a data storage system.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments disclosed therein may include their complementary embodiments. Note that detailed data access operations and internal function circuits of a flash memory device and detailed configuration and operation of a data storage system may be skipped to prevent the inventive concept from becoming ambiguous.

FIG. 1 is a block diagram schematically illustrating an example embodiment of a data storage system.

Referring to FIG. 1, a data storage system includes a controller 100 and a memory device 200. Memory device 200 includes an input buffer circuit 220 and a memory circuit 240. Memory device 200 may include other elements not shown in FIG. 1.

During a read operation mode, controller 100 sends a strobe signal to memory device 200 via a line L10. Input buffer circuit 220 of memory device 200 generates a read enable clock /RE based on the strobe signal. The read enable clock /RE is applied to memory circuit 240. Memory circuit 240 reads data stored in a memory cell of a memory cell array in response to the read enable clock /RE. The read data is provided to controller 100.

In case memory circuit 240 is a nonvolatile semiconductor memory such as a flash memory, a clock signal for a data read operation, that is, the read enable clock /RE may not be produced from, for example, a clock generation circuit. Instead, the read enable clock /RE may be generated using the strobe signal. Thus, input buffer 220 may be a circuit that produces the read enable clock /RE using the strobe signal.

Since the read enable clock /RE is not required in a standby operation mode, no strobe signal is provided via the line L10 during standby. That is, in an idle period the strobe signal does not exist at the data storage system.

If the strobe signal is blocked during a period of time and is again applied to the line L10, a first clock edge of the strobe signal may be distorted due to frequency characteristics of the communication channel between controller 100 and memory device 200, and/or characteristics of memory device 200 itself. This means that the first clock edge of the strobe signal applied after an idle period suffers the most influence of Inter Symbol Interference (ISI).

To reduce the ISI due to frequency characteristics of the channel and/or device, an equalizing scheme or a pre-emphasis/de-emphasis scheme may be applied to a random-data-pattern signal. Meanwhile, since a clock-pattern signal does not suffer influence of a frequency characteristic of a channel, a method of compensating for the clock-pattern signal may not be used.

If a strobe signal provides a memory device, which makes a clock for read using the strobe signal, after a long idle time, a first clock edge may be distorted relatively much compared to another clock edge. Due to influence of the ISI, the first clock edge portion may be distorted at both a point in time when controller 100 outputs the strobe signal and an input point in time when input buffer circuit 220 receives the strobe signal. A first clock edge portion is distorted when a strobe signal is again received after a long-time idle; therefore, a first clock edge portion of a read enable clock that is generated by buffering it is also distorted. Performance of a data read operation may be degraded if the read enable clock is not properly generated.

In exemplary embodiments, a first clock edge portion of the strobe signal is boosted through input buffer circuit 220, and boosting is disabled for a second clock edge portion of the strobe signal. An on/off duty cycle of the first clock edge portion is forced to be increased due to the boosting of the first clock edge portion; in particular in some embodiments it exceeds 50%.

In exemplary embodiments, the term "boosting" is used to indicate boosting of a duty ratio or duty cycle of a clock edge portion. This boosting of a duty cycler of a clock edge portion may be different from boosting of a voltage level.

Figure 2:
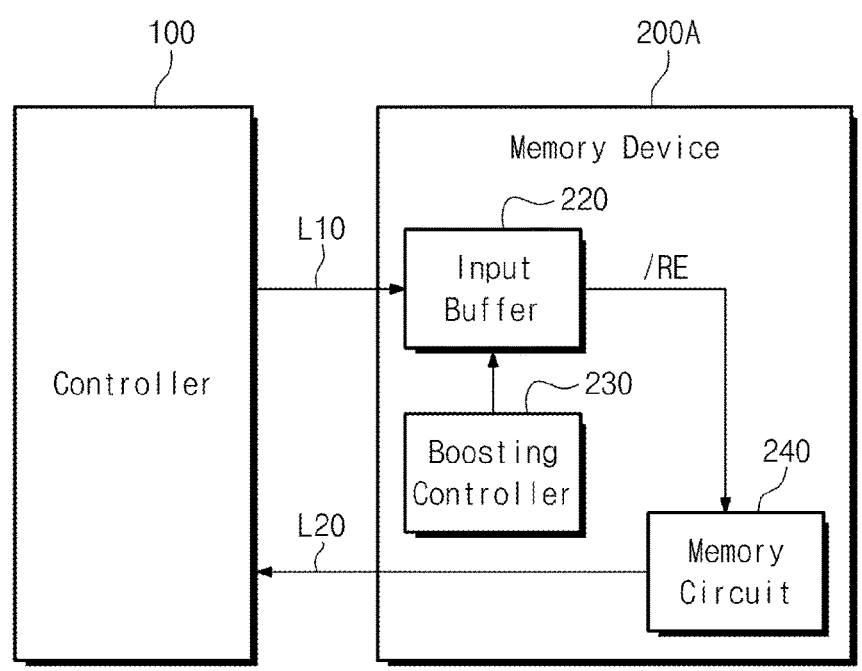
FIG. 2 is a block diagram schematically illustrating another example embodiment of a data storage system.

FIG. 2 is a block diagram schematically illustrating another example embodiment of a data storage system.

The data storage system of FIG. 2 includes a controller 100 and a memory device 200A. Memory device 200A differs from memory device 200 of the data storage system of FIG. 1 in that it further includes a boosting controller 230.

Boosting controller 230 may apply a boosting enable signal to input buffer circuit 220 when a strobe signal is received after being blocked over a period of time, for example a period of time which exceeds a predetermined period. After a first clock edge portion of the strobe signal is forcibly boosted, boosting controller 230 provides input buffer circuit 220 with a boosting disable signal for disabling boosting of a second clock edge portion of the strobe signal. In some embodiments, the boosting disable signal has a logical low level (or, logical "0") when the boosting enable signal has a logical high level (or, logical "1"). However, modification or change to logical states of the boosting enable signal and the boosting disable signal may be variously made as appropriate or convenient for a given circuit.

Figure 3:
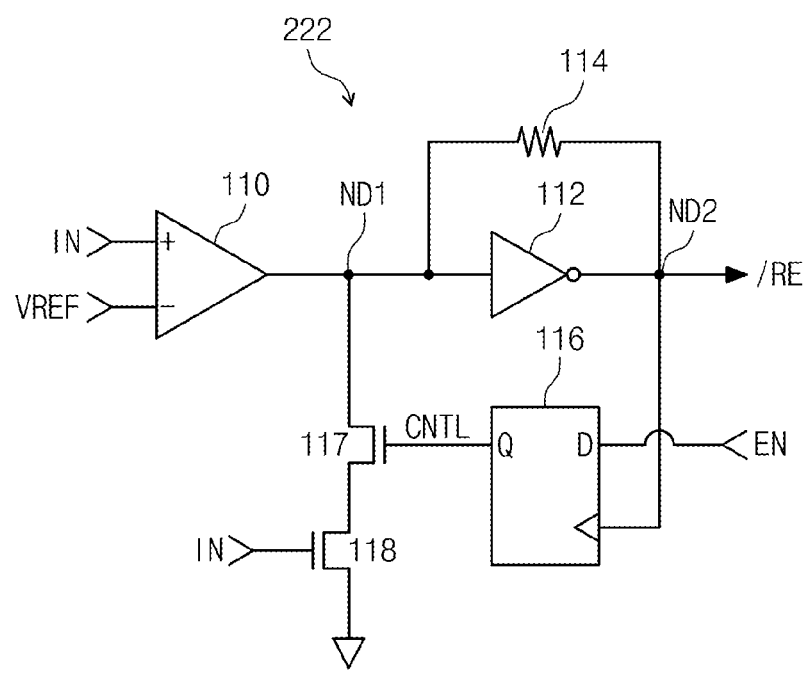
FIG. 3 is a circuit diagram schematically illustrating an embodiment of a strobe signal shaping circuit which may be applied to an input buffer circuit shown in FIG. 1 or 2.

FIG. 3 is a circuit diagram schematically illustrating an embodiment of a strobe signal shaping circuit 222 which may be applied to an input buffer circuit shown in FIG. 1 or 2.

Referring to FIG. 3, as an input buffer circuit, strobe signal shaping circuit 222 contains a buffer 110, an inverter 112, a resistor 114, a flip-flop 116, and first and second MOS transistors 117 and 118. Inverter 112, resistor 114, flip-flop 116, and first and second MOS transistors 117 and 118 constitute a boosting circuit.

First buffer 110 buffers a strobe signal received as an input IN according to a reference voltage VREF to output it to a buffering output node ND1. In this embodiment, boosting enable signal EN has a logical high level while the strobe signal is not received as the input IN due to a long-time idle state. In case flip-flop 116 is a D flip-flop, during an idle state it may maintain a state which existed before the idle state. The reason for this is that a clocking signal is not applied to a clock terminal of flip-flop 116. Since an output terminal Q of flip-flop 116 maintains a logical high level, a boosting control signal CNTL has a high state. It is assumed that second MOS transistor 118 has been turned on by the input IN being at a high level at this time. Since first MOS transistor 117 is turned on in response to a high state of the boosting control signal CNTL, a voltage level at the buffer output node ND1 when first MOS transistor 118 is turned on becomes lower than when it is turned off. Since a current path is formed between the buffering output node ND1 and ground via turned-on MOS transistors 117 and 118, a common-mode voltage level of a buffer 110 decreases during an idle period of the strobe signal.

If the strobe signal is received in the above condition, a first clock edge portion of the strobe signal is forcibly boosted, thereby increasing an on/off duty cycle. For example, a duty cycle of the first clock edge portion may be increased to be up to 53:47.

The boosting enable signal EN transitions to a logical low level if the first clock edge portion passes. That is, a boosting disable signal is applied to an input terminal D of flip-flop 116. The boosting control signal CNTL goes to a low state when a second clock edge portion is received, thereby making it possible to turn off first MOS transistor 117, thereby blocking a current path between the buffering output node ND1 and ground. Since a current path between the buffering output node ND1 and a ground is blocked, a voltage level at the buffering output node ND1 when first MOS transistor 117 is turned off becomes higher than when it is turned on. As understood from the above description, a common-mode voltage level of buffer 110 may increase from the second clock edge portion of the strobe signal; thereby, it is returned to an original common-mode voltage level.

Figure 4:
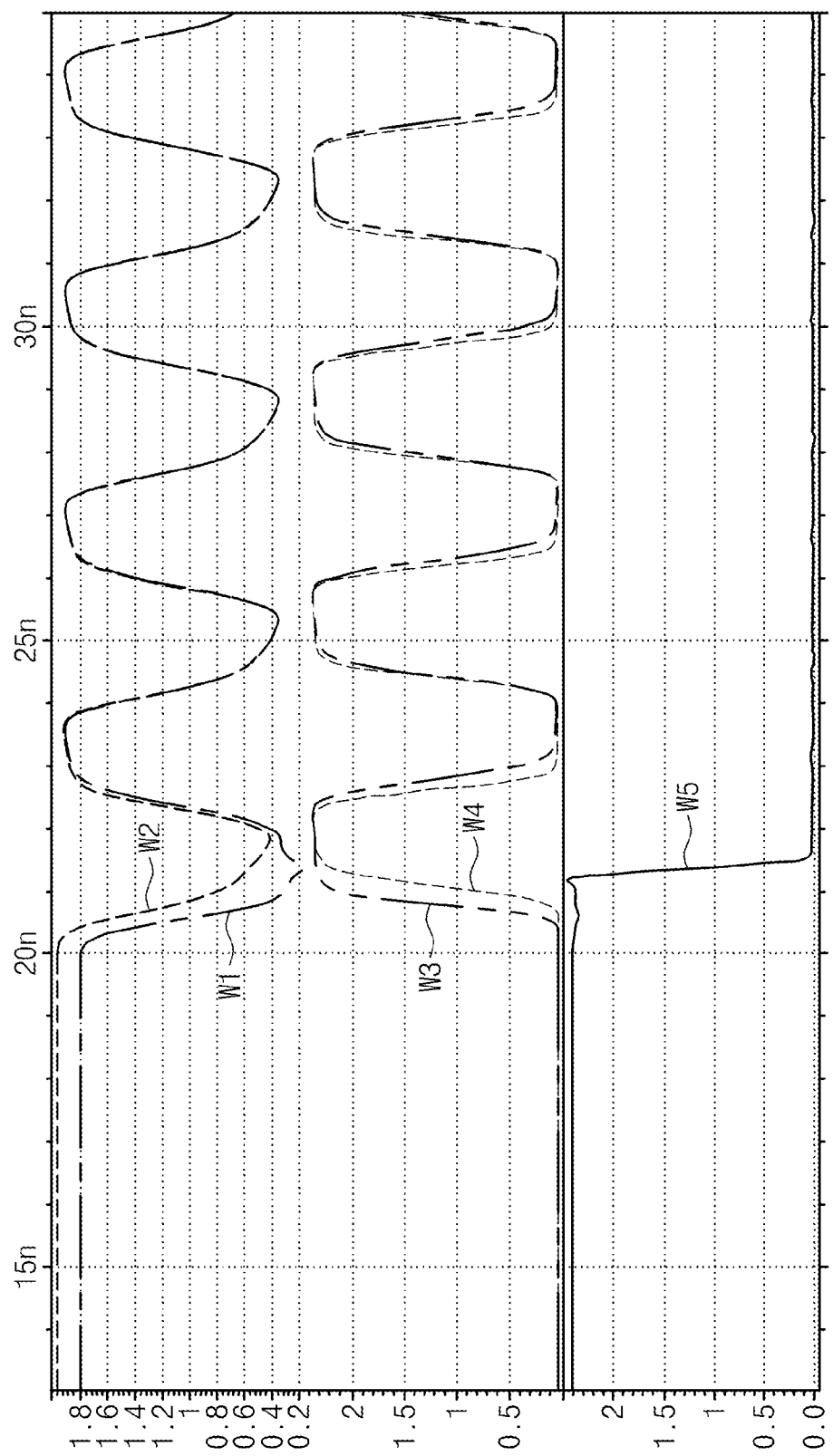
FIG. 4 is a timing diagram for describing an example operation of a circuit shown in FIG. 3.

FIG. 4 is a timing diagram for describing an example operation of circuit 222 shown in FIG. 3.

In FIG. 4, the horizontal axis represents time (e.g., in nanoseconds), and the vertical axis represents a voltage.

In FIG. 4, a waveform W1 is a waveform that appears on an output node ND1 of a buffer 110 shown in FIG. 3 when a boosting control signal CNTL is in a high state. Meanwhile, if boosting is not performed (the boosting control signal CNTL is in a low state), a waveform of the first clock edge portion of the strobe signal may be the same as the waveform W2. Here, referring to the waveform W1, the duty cycle of a first clock edge portion of a strobe signal increases relatively compared to a waveform W2, due to a boosting enable signal. As understood from a waveform W5, however, a common-mode voltage at the output node ND1 when the boosting control signal CNTL is in a high state is less than that when it is in a low state. If a first clock of the strobe signal is applied to an input terminal IN of buffer 110 shown in FIG. 3 under the above-described condition, a waveform of the first clock edge portion of the strobe signal appears at the output node ND1 as a duty cycle which is expanded like the waveform W1. A waveform W3 is generated by inverting the waveform W1 via inverter 112 shown in FIG. 3 the waveform W3 appears at an output node ND2 of FIG. 3 and is used as a read enable clock /RE. If the waveform W2 appears at the output node ND1 without a boosting operation, the read enable clock /RE having a waveform W4 is generated, thereby distorting a first clock edge portion. In case of an embodiment described herein, however, the first clock edge portion of the strobe signal has such a waveform as W1 through boosting. If the boosting control signal CNTL goes to a logical low state at a high-to-low transition of the first clock edge portion in the waveform W1, a common-mode voltage at the output node ND1 may increase, for example, by about 0.2 V in case of FIG. 4. Boosting is not disabled from a waveform of a second clock edge portion of the strobe signal. In an embodiment described herein, an operation where a first clock edge portion of the strobe signal is boosted is referred to as a special operating mode, and an operation where boosting is disabled from a second clock edge portion is referred to as a normal operating mode.

If the strobe signal is not provided as the input IN due to a an idle state for an extended time period, a boosting enable signal EN and a boosting control signal CNTL are set to a logical high level. A first clock edge portion of the strobe signal is boosted when the strobe signal is received under the above-described condition. Afterwards, as the boosting control signal CNTL is set to a low state, an operating mode enters a normal operating mode in which boosting is turned off from a second clock edge portion of the strobe signal.

With the above description, it is possible to make compensation for distortion of a first clock edge portion of a strobe signal input after an extended idle period. This means that it is possible to compensate for a first clock edge portion of a read enable clock /RE that is generated by buffering the strobe signal. Thus, it is possible to prevent or minimize a decrease in performance on a data read operation.

Figure 5:
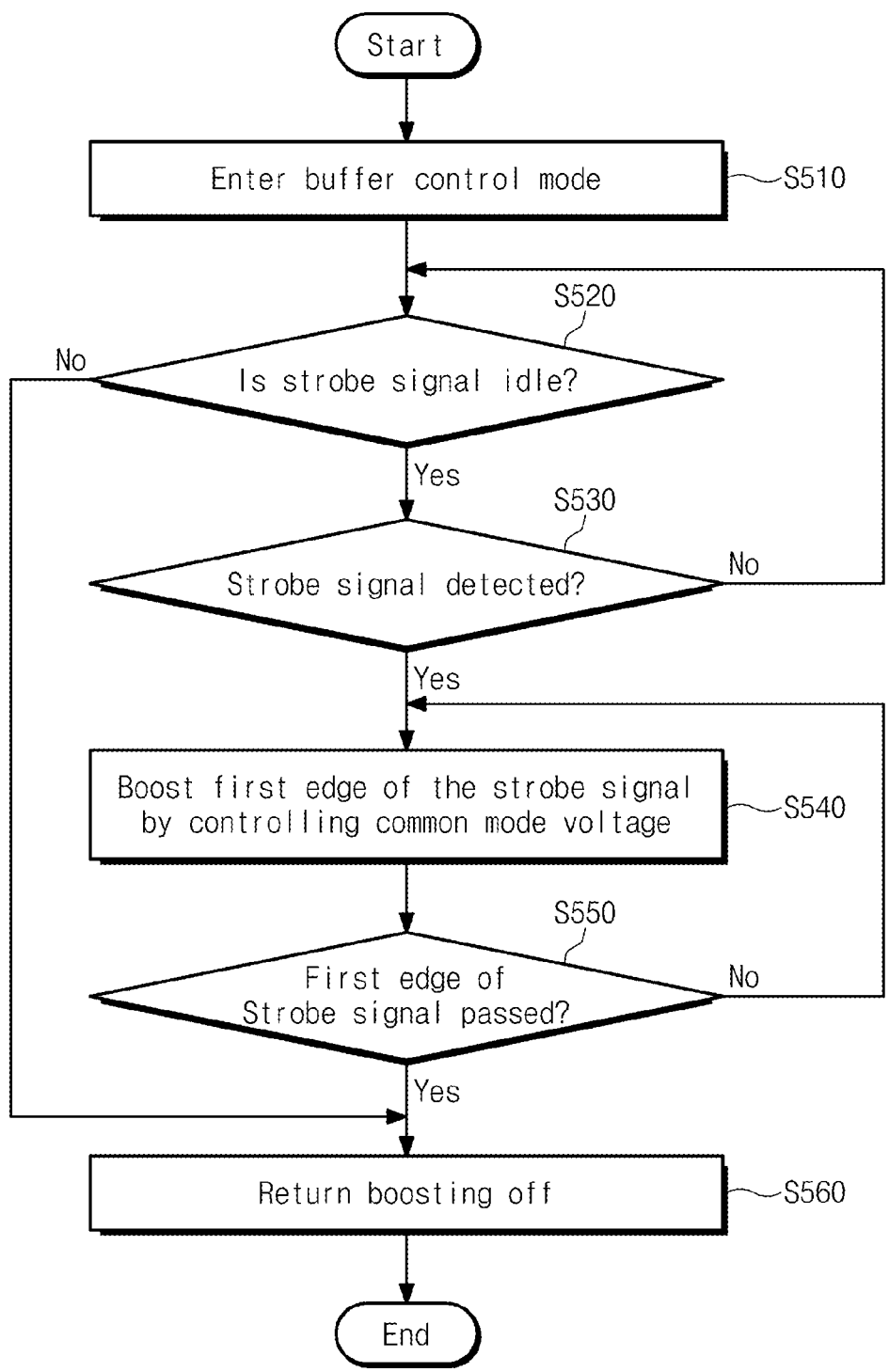
FIG. 5 shows a flow chart of an exemplary embodiment of a strobe signal shaping procedure.

FIG. 5 shows a flow chart of one embodiment of a strobe signal shaping procedure.

In step S510, to the procedure enters a buffer control mode. That is, memory device 200/200A determines whether to drive a circuit of FIG. 3 to boost a first clock edge portion of a strobe signal. Entering the buffer control mode is made if memory device 200/200A receives a selection control signal associated with boosting from controller 100. Entering the buffer control mode is not made if memory device 200/200A does not receive the selection control signal from controller 100.

In step S520, it is determined or ascertained whether the strobe signal is in an idle state. When an input terminal IN of FIG. 3 is maintained at a logical low state it means that the strobe signal is in an idle state.

In step S530, it is determined whether the strobe signal is received. If the strobe signal is first received in the idle state, a voltage at the input terminal IN of FIG. 3 starts to increase from a logical low level to a logical high level.

In step S540, a first clock edge portion of the strobe signal is boosted. Boosting may be accomplished by lowering a common-mode voltage at an output node ND1 of FIG. 3 until a second clock edge portion is received. That is, a high level of a boosting control signal CNTL is maintained until the boosting is completed. To maintain a high level corresponds to an operation of controlling the common-mode voltage.

In step S550, it is determined whether the first clock edge portion of the strobe signal has passed. For example, referring to FIG. 4, since the first clock edge portion passes at a point in time of 21 nanoseconds, at that point the boosting control signal CNTL transitions from a high level to a low level.

In step S560, boosting is turned off for a second clock edge portion of the strobe signal; thus, a duty cycle of a signal is maintained with 50:50 (or perhaps, slightly greater than 50:50, for example 53:47). Thus, a common-mode voltage at the output node ND1 is returned to a level corresponding to a normal operation state if the boosting control signal CNTL transitions to a low level.

Thus, a read enable clock is normally generated although a receiving quality of the strobe signal deteriorates, thereby improving performance of a data read operation.

In other words, the influence of ISI on a first clock edge portion is reduced by lowering a common-mode voltage of an output terminal of a buffer during an idle time of the buffer. Also, boosting is turned off as soon as the influence of ISI on a first clock edge portion is reduced. This means that boosting is not performed during a normal mode of operation.

This boosting scheme may be more efficient in a multi-stage stack memory system. Since loading capacitance in the multi-stage stack memory system may be greater than that in a single memory system, a first clock edge portion is seriously distorted. Thus, it is possible to improve performance of a read operation by using the boosting scheme described above.

Meanwhile, an embodiment has been illustrated wherein a first clock edge portion of a strobe signal is boosted. However, in other embodiments $2^{nd}$, $3^{rd}$, $4^{th}$, and $5^{th}$ clock edge portions may be boosted by changing the circuit shown in FIG. 3. A boosting target has been described above as being a strobe signal. However, in other embodiments, it may be possible to boost a clock signal or all signals each having a high- and a low-pulse period.

Figure 6:
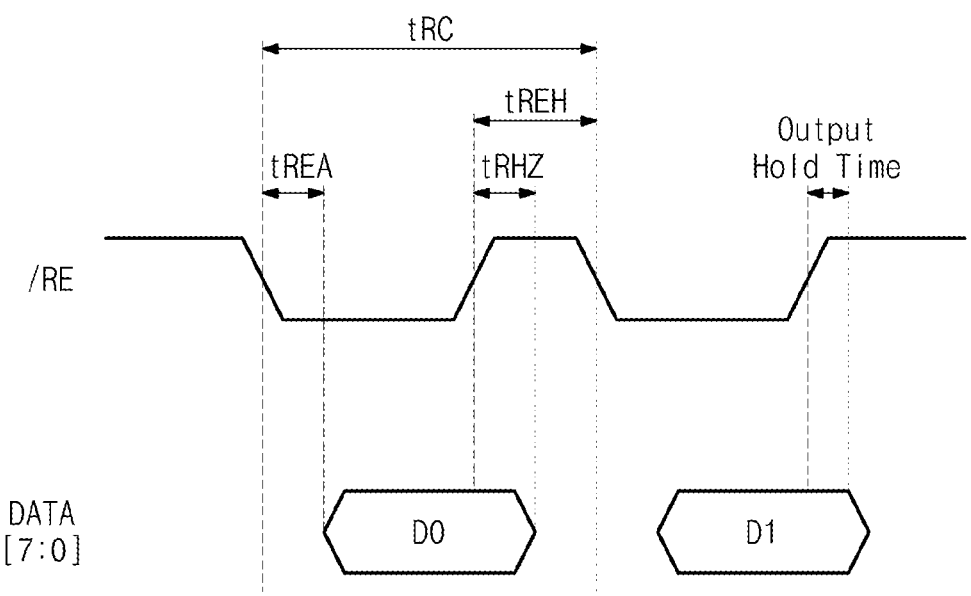
FIG. 6 is a timing diagram of an example of a read operation of the data storage system of FIG. 1 or 2.

FIG. 6 is a timing diagram of an example of a read operation of the data storage system of FIG. 1 or 2.

Input buffer circuit 220 shown in FIG. 1 or 2 compensates for distortion of a first clock edge portion to generate a read enable clock /RE.

Memory circuit 240 outputs data DATA[7:0] based on the read enable clock /RE.

If memory circuit 240 outputs data DATA[7:0] every read cycle time (marked by "tRC"), then its maximum performance may be achieved. This is referred to as a 1-cycle access by controller 100. If the 1-cycle access is carried out, theoretically, memory device 200/200A may operate with maximum performance. In FIG. 6, "tREA" represents a /RE access time, "tRHZ" represents /RE high to Output Hi-Z, and "tREH" represents a /RE High hold time.

A read enable clock used in FIG. 6 is a clock that is generated without distortion or with minimum distortion by via boosting a first clock edge portion of a strobe signal. Thus, a data read operation may be performed without errors.

Figure 7:
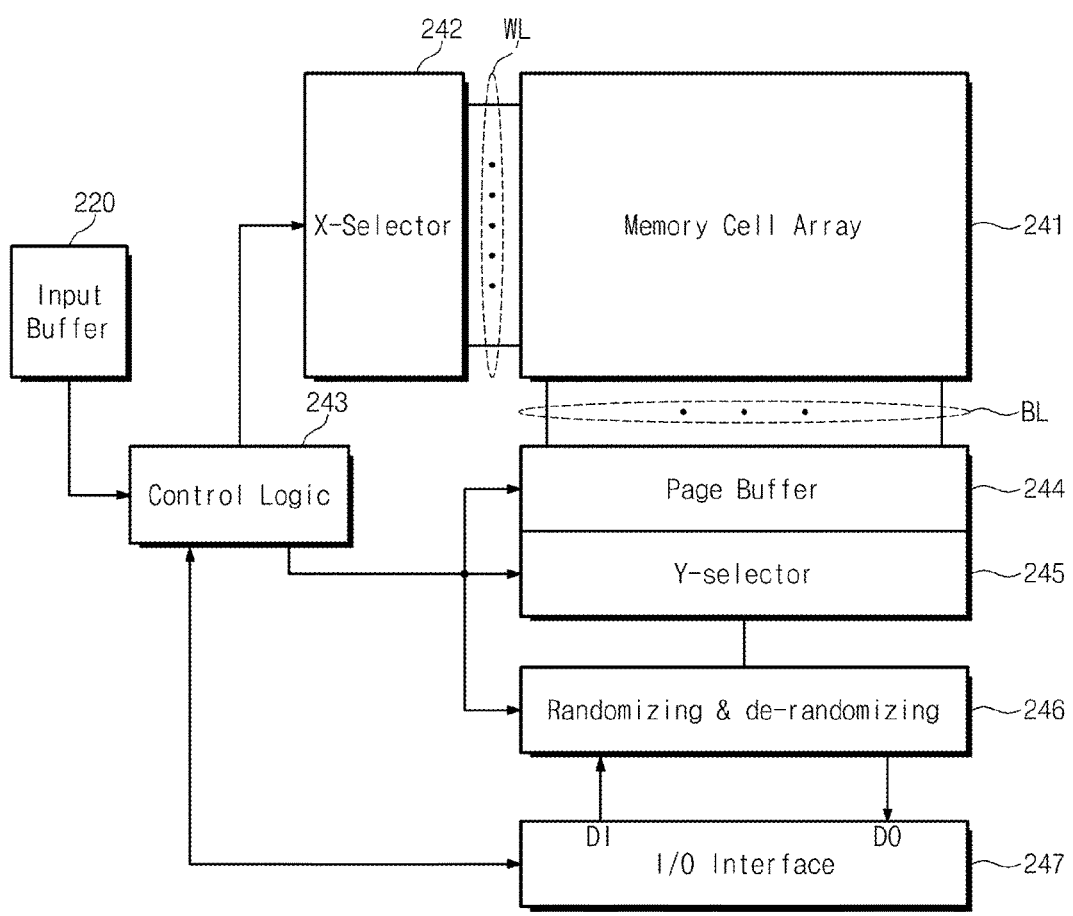
FIG. 7 is a block diagram schematically illustrating an exemplary embodiment of a flash memory device as a memory device of a data storage system.

FIG. 7 is a block diagram schematically illustrating an exemplary embodiment of a flash memory device as a memory device of a data storage system.

Referring to FIG. 7, the flash memory device is a NAND flash memory device, for example. However, in other embodiments the memory device may be, but not be limited to, Electrically Erasable Programmable Read-Only Memory (EEPROM), Magnetic RAM (MRAM), Spin-Transfer Torque MRAM, Conductive bridging RAM (CBRAM), Ferroelectric RAM (FeRAM), Phase change RAM (PRAM) called Ovonic Unified Memory (OUM), Resistive RAM (RRAM or ReRAM), Nanotube RRAM, PoRAM (Polymer RAM), Nano Floating Gate Memory (NFGM), holographic memory, Molecular Electronics Memory Device, or Insulator Resistance Change Memory.

The flash memory device of FIG. 7 includes: a memory cell array 241, a row selector 242, control logic 243, a page buffer 244, a column selector 245, a randomizing and de-randomizing unit 246, and an input/output (I/O) interface 247. Memory cell array 241 has memory cells arranged in rows (word lines: WL) and columns (bit lines: BL). Each memory cell may store 1-bit data or M-bit (multi-bit) data (M being an integer of two or more). When each memory cell stores 1-bit data, memory cells in each row of memory cell array 241 may constitute a memory space. When each memory cell stores M-bit data, memory cells in each row of memory cell array 241 may constitute memory spaces corresponding to multiple pages, respectively. Each memory cell may have a charge storing layer, such as a floating gate or a charge trap layer, or a variable resistance element, for example. Memory cell array 241 may have a single-layer array structure (referred to as a two-dimensional array structure) or a multi-layer array structure (referred to as a vertical-type or stack-type three-dimensional array structure).

Row selector 242 is controlled by control logic 243 and is configured to perform selection and driving operations on rows of memory cell array 241.

Control logic 243 may be configured to control overall operations of the flash memory device, as well.

Page buffer 244 is controlled by control logic 243 and is configured to operate as a sense amplifier or a write driver according to a mode of operation. For example, during a read operation, page buffer 244 may operate as a sense amplifier, which senses data from a selected row of memory cells. During a program operation, page buffer 244 may operate as a write driver, which drives a selected row of memory cells according to program data. Page buffer 244 may include page buffer elements corresponding to bit lines or bit line pairs, respectively. When each memory cell stores multi-bit data, each page buffer element of page buffer 244 may be configured to have two or more latches.

Continuing to refer to FIG. 7, column selector 245 is controlled by control logic 243 and is configured to sequentially select columns (or page buffer elements) by a predetermined unit during read/program operations. Randomizing and de-randomizing unit 246 randomizes data (i.e., data to be programmed or original data), which is transferred via input/output interface 247, under control of control logic 243. Randomizing and de-randomizing unit 246 also de-randomizes data (i.e., randomized data) of page buffer 244 transferred via column selector circuit 245, under control of control logic 243.

Randomizing and de-randomizing unit 246 may be configured to perform randomizing and de-randomizing operations with respect to not only full-page data, but also to randomize data which is less than the full-page data: e.g., the randomized data may be data of a spare region, sector data, data greater in size than sector data and smaller than page data, or data which is smaller in size than sector data.

A memory cell may have any one of $2^N$ threshold voltage distributions (N indicating the number of data bits stored in a memory cell) according to the amount of charge stored in its charge storing means. A threshold voltage (or, a threshold voltage distribution) of a memory cell may be changed due to coupling (i.e., word line coupling) caused between adjacent memory cells.

With the data randomizing, it is possible to reduce a variation in threshold voltages of memory cells due to the word line coupling. In other words, since states of memory cells are distributed uniformly, the degree of the word line coupling among memory cells may be relatively less than that before data is randomized. That is, the variation in threshold voltages of memory cells may be suppressed. Accordingly, the read margin and thus reliability are improved.

The randomizing and de-randomizing operations may be performed selectively. When an access to specific data or a specific region is requested, randomizing and de-randomizing unit 246 may be configured not to perform randomizing and de-randomizing operations.

In the flash memory device where M-bit data is stored in each memory cell, a voltage with a predetermined level is supplied to a word line of a memory cell selected for a read operation. In a read method, there may be sequentially carried out operations of starting a word line voltage by supplying a voltage higher than the predetermined level to the word line; providing the word line with the voltage having the predetermined level; and setting a word line voltage with the predetermined level to perform a read operation.

That is, in case the flash memory device includes multi-level cells, low-level, intermediate-level, and high-level voltages may be selectively supplied to a word line in a read operation.

In case the low-level voltage is supplied to a word line, it is supplied to the word line after a word line voltage is started by supplying the intermediate-level voltage to the word line.

Meanwhile, in case the intermediate-level voltage is supplied to a word line, it is supplied to the word line after a word line voltage is started by supplying the high-level voltage to the word line.

Also, in case the high-level voltage is supplied to a word line, it is supplied to the word line after a word line voltage is started by supplying a voltage higher than the high-level voltage to the word line.

The read method includes operations of supplying the highest-level voltage to the word line to perform a read operation; and discharging the word line voltage so as to be step-downed, a read operation being performed by providing the word line with the step-downed voltage lower than the word line voltage when it becomes lower than the step-downed voltage.

The read method makes a start-up time of the word line short, thereby enabling a high-speed read operation and insuring a margin. A sub decoder may be removed because there are only required voltage discharging and converting circuits in a read operation.

In FIG. 7, input buffer circuit 220 may receive a strobe signal from controller 100 (see FIGS. 1 and 2). Input buffer circuit 220 boosts a first clock edge portion of the strobe signal to generate a read enable clock without distortion or with reduced or minimal distortion. Control logic 243 controls a read operation using this read enable clock in which the influence of ISI is reduced, thereby improving performance of a data read operation of the flash memory device.

Figure 8:
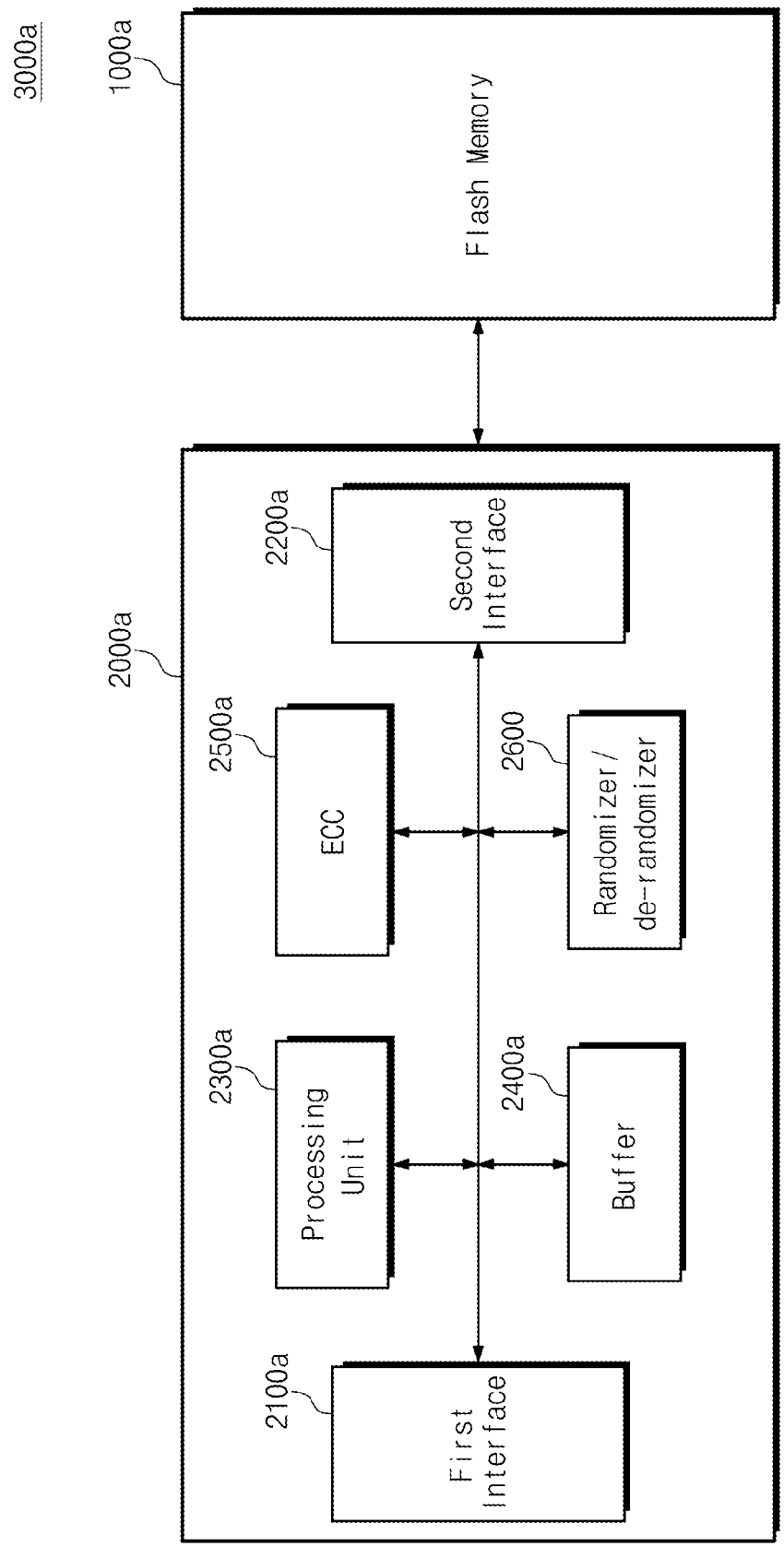
FIG. 8 is a block diagram illustrating an exemplary embodiment of a memory system.

FIG. 8 is a block diagram illustrating an exemplary embodiment of a memory system.

Referring to FIG. 8, a memory system 3000a includes at least one flash memory 1000a and a controller 2000a.

Flash memory 1000a operates under the control of controller 2000a and is used as a storage medium. Flash memory 1000a in FIG. 8 may be a typical flash memory, which does not support a randomizing and de-randomizing operation being performed internally. Thus, controller 2000a, which controls flash memory 1000a, is configured to randomize data to be stored in flash memory 1000a and to add ECC data to the randomized data. Controller 2000a may be configured to perform detecting and correcting operations on errors of randomized data read out from flash memory 1000a and de-randomize the randomized data.

Controller 2000a includes a first interface 2100a, a second interface 2200a, a processing unit 2300a, a buffer memory 2400a, an ECC block 2500a, and a randomizer/de-randomizer unit 2600.

First interface 2100a may support a variety of protocols for exchanging data between a host and controller 2000a. Controller 2000a may communicate with a host or an external device through at least one of various interface protocols, such as Universal Serial Bus (USB) protocol, MultiMediaCard (MMC) protocol, peripheral component interconnection (PCI) protocol, PCI-express (PCI-E) protocol, Advanced Technology Attachment (ATA) protocol, serial-ATA protocol, parallel-ATA protocol, small computer small interface (SCSI) protocol, enhanced small disk interface (ESDI) protocol, and Integrated Drive Electronics (IDE) protocol.

Randomizer/de-randomizer unit 2600 may randomize data output from the buffer memory 2400a. Randomizer/de-randomizer block 2600 may de-randomize data (i.e., randomized data) read out from flash memory 1000a.

ECC block 2500a generates ECC data based on randomized data output from randomizer/de-randomizer block 2600. Further, ECC block 2500a performs an error detecting and correcting operation on data read out from flash memory 1000a, that is, randomized data based upon ECC data. The ECC data may be stored in the same page as data to be stored in flash memory 1000a or in a region different from data to be stored in flash memory 1000a.

In case of memory system 3000a shown in FIG. 8, a write operation may include randomizing data to be stored in flash memory 1000a; generating ECC data based on the randomized data; and storing the ECC data and the randomized data in flash memory 1000a. Alternately, the write operation may include randomizing the data to be stored and the ECC data to store a randomized result in flash memory 1000a. A read operation may include performing error detecting and correcting operations on read data (i.e., randomized data) based on ECC data; and de-randomizing the read data.

In FIG. 8, flash memory 1000a may receive a strobe signal from controller 2000a. An internal circuit of flash memory 1000a boosts a first clock edge portion of the strobe signal to generate a read enable clock without distortion or with minimal or reduced distortion. Flash memory 1000a controls a read operation using a read enable clock in which the influence of ISI is reduced, thereby improving performance of a data read operation.

Figure 9:
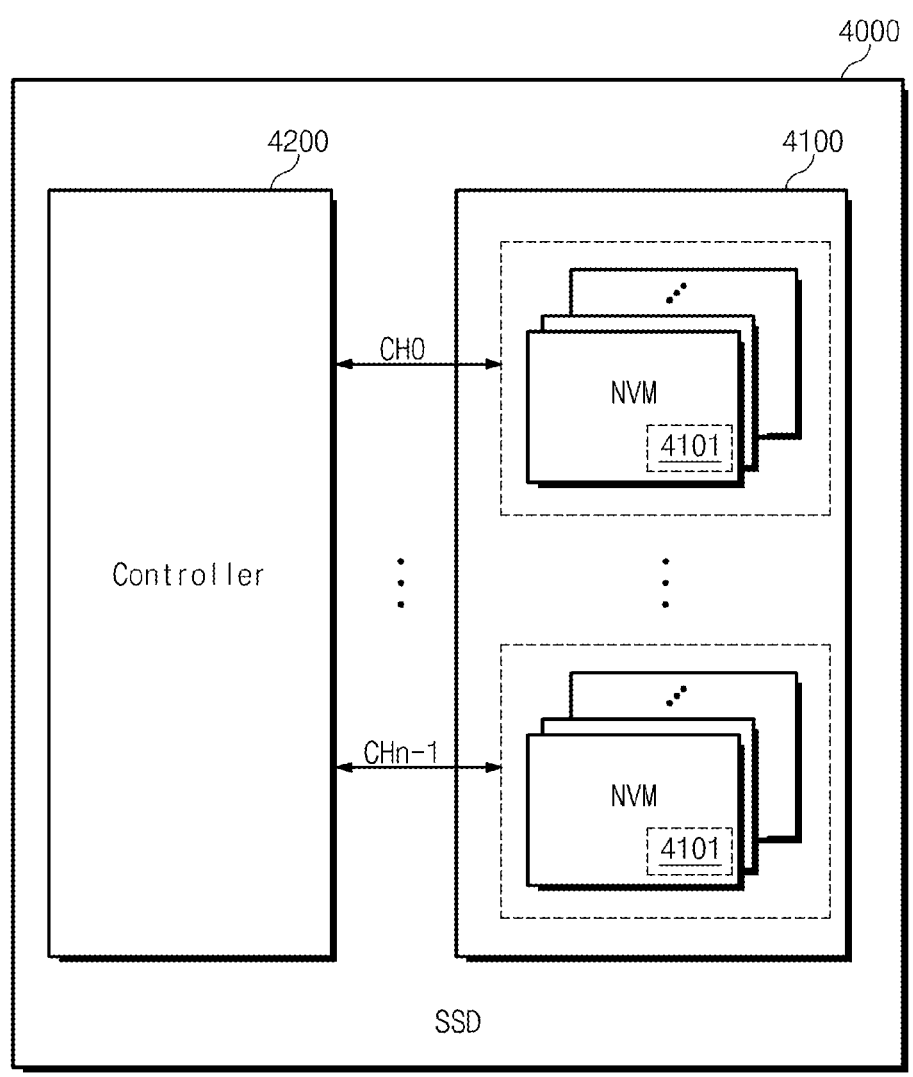
FIG. 9 is a block diagram illustrating an exemplary embodiment of a solid state drive.

FIG. 9 is a block diagram illustrating an exemplary embodiment of a solid state drive (SSD) 4000.

Referring to FIG. 9, SSD 4000 includes storage medium 4100 and a controller 4200. Storage medium 4100 is connected to controller 4200 via channels CH0 to CHn−1. Each of the channels CH0 to CHn−1 is connected in common with nonvolatile memories NVM. Each nonvolatile memory NVM may be formed of a flash memory shown in FIG. 7, for example.

Nonvolatile memory devices connected to a channel (e.g., CH0) are used to store single-bit data (e.g., metadata, parity data, and so on), and nonvolatile memory devices connected to remaining channels (e.g., CH1 to CHn−1) are used to store multi-bit data. In this case, controller 4200 turns off randomization of nonvolatile memory devices connected to the channel CH0 using a set feature command. Likewise, controller 4200 may set randomization-off areas of nonvolatile memory devices connected to each of the remaining channels CH1 to CHn−1 using the set feature command.

In FIG. 9, storage medium 4100 boosts a first clock edge portion of a strobe signal to generate a read enable clock without distortion or with minimal or reduced distortion. SSD 4000 performs a read operation using a read enable clock in which the influence of ISI is reduced, thereby improving performance of a data read operation.

Figure 10:
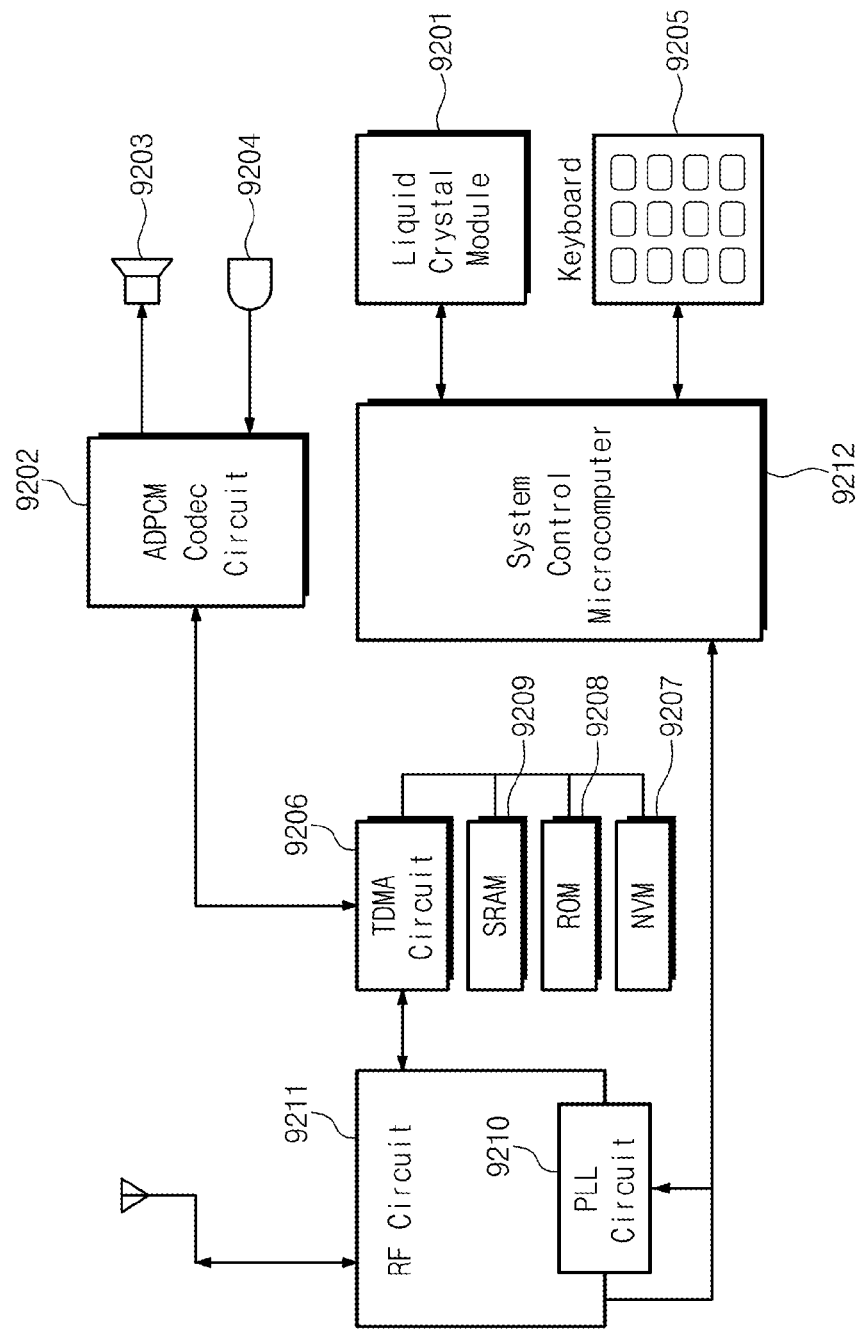
FIG. 10 is a block diagram illustrating an exemplary embodiment of a cellular phone system including a flash memory device.

FIG. 10 is a block diagram illustrating an exemplary embodiment of a cellular phone system including a flash memory device.

Referring to FIG. 10, a cellular phone system may include an Adaptive Differential Pulse-Code Modulation (ADPCM) codec circuit 9202 for compressing a voice and decompressing a compressed voice, a speaker 9203, a microphone 9204, a Time Division Multiple Access (TDMA) circuit 9206 for time-division multiplexing digital data, a Phase Locked Look (PLL) circuit 9210 configured to set a carrier frequency of a radio frequency signal, an RF circuit 9211 configured to send and receive a radio frequency signal, and so on.

Further, the cellular phone system may include various types of memories, such as a flash memory device 9207 as a nonvolatile memory device, a ROM 9208, and an SRAM 9209. As memory device 9207 of the cellular phone system may be used a flash memory device described with reference to FIG. 7. ROM 9208 may be used to store programs, and SRAM 9209 may be used as a working region for system control microcomputer 9212 or as a memory for temporarily storing data. Herein, system control microcomputer 9212 may be a processor that is configured to control write and read operations of flash memory device 9207.

If a boosting scheme as described above is implemented in the cellular phone system of FIG. 10, performance is improved at a read operation, thereby bettering reliability of the cellular phone system.

FIG. 10 has been described as being a cellular phone system. However, in other embodiments, the cellular phone system may be modified or changed to a computer, an ultra-mobile personal computer (UMPC), a workstation, a net-book, a personal digital assistant (PDA), a portable computer (PC), a web tablet, a wireless phone, a three-dimensional television, an e-book, a portable multimedia player (PMP), a portable game console, a navigation device, a black box, a digital camera, a digital multimedia broadcasting (DMB) player, a digital audio recorder, a digital audio player, a digital picture recorder, a digital picture player, a digital video recorder, a digital video player, a device for transmitting and receiving information in a wireless environment, one of a variety of electronic devices constituting a home network, one of a variety of electronic devices constituting a computer network, one of a variety of electronic devices constituting a telematics network, a radio frequency identification (RFID) device, or one of various components constituting a computing system.

Figure 11:
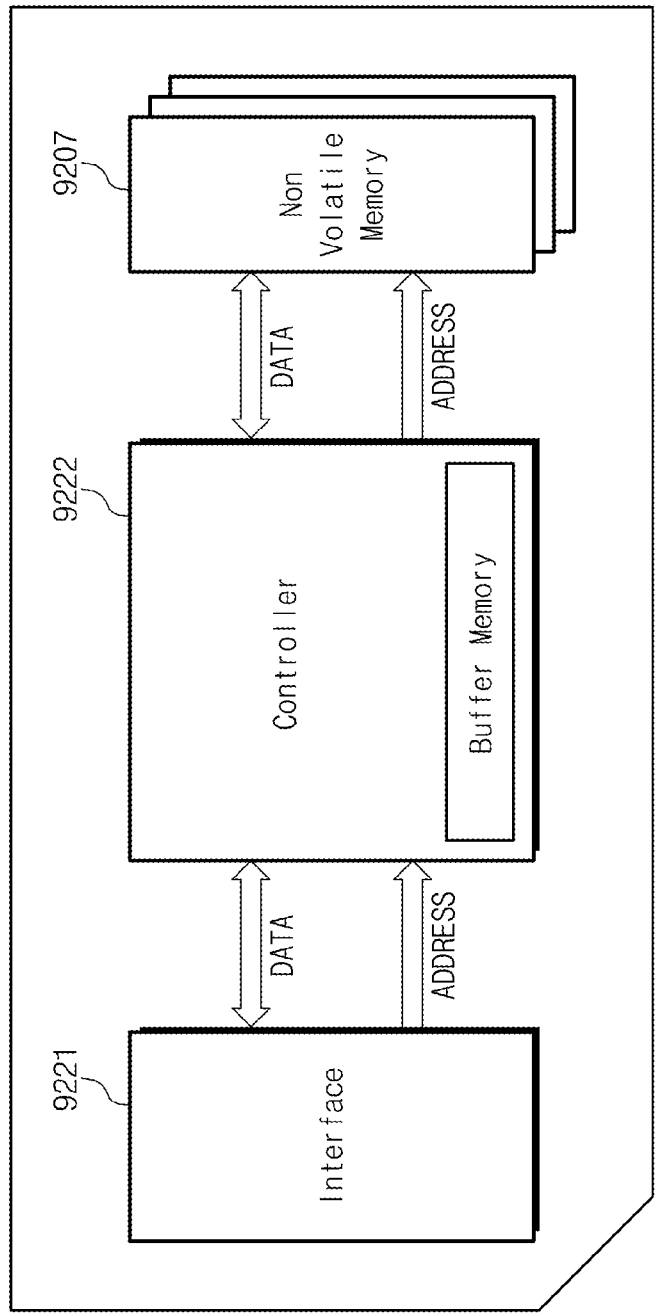
FIG. 11 is a block diagram illustrating an exemplary embodiment of a memory card including a flash memory device.

FIG. 11 is a block diagram illustrating an exemplary embodiment of a memory card including a flash memory device.

A memory card, for example, may be a MultiMediaCard (MMC), an SD card, a multiuse card, a micro-SD card, a memory stick, a compact SD card, an ID card, a Personal Computer Memory Card International Association (PCM-CIA) card, an SSD card, a chip-card, a smartcard, a USB card, a Multi-Chip Package (MCP)-type embedded card storage device, and so on. The MCP-type embedded card storage device may include an embedded MMC (eMMC), an embedded SD (ESD), an embedded SSD (eSSD), a Perfect Page NAND (PPN), and so on.

Referring to FIG. 11, the memory card may include an interface circuit 9221 for interfacing with an external device, a controller 9222 including a buffer memory and controlling an operation of the memory card, and at least one flash memory device 9207. Controller 9222 may be a processor which is configured to control write and read operations of flash memory device 9207. In particular, controller 9222 may be coupled with nonvolatile memory device 9207 and interface circuit 9221 via a data bus DATA and an address bus ADDRESS.

If a boosting scheme as described above is implemented in the memory card of FIG. 11, performance is improved at a read operation, thereby improving reliability of the memory card.

Figure 12:
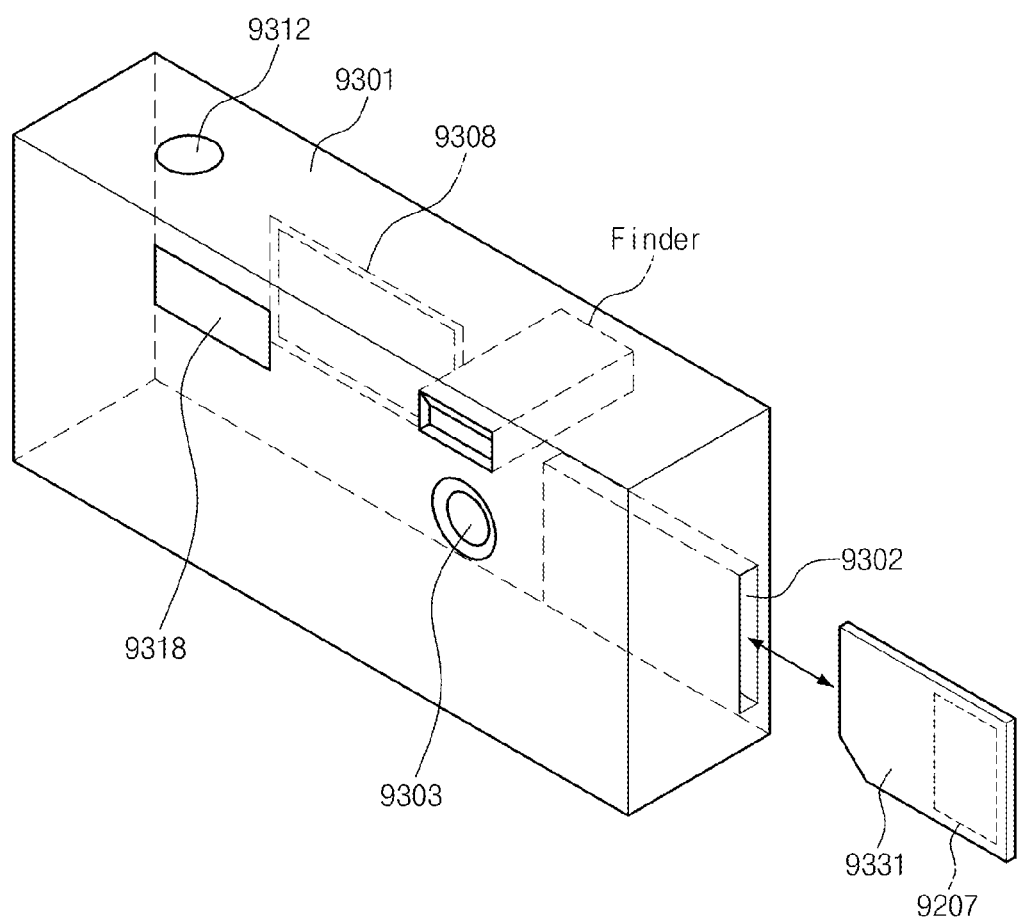
FIG. 12 is a block diagram illustrating an exemplary embodiment of a digital still camera using a memory card.

FIG. 12 is a block diagram illustrating an exemplary embodiment of a digital still camera using a memory card.

Referring to FIG. 12, a digital still camera may include a body 9301, a slot 9302, a lens 9303, a display circuit 9308, a shutter button 9312, a strobe 9318, and so on. In particular, a memory card 9331 may be inserted in slot 9302, and it may include at least one flash memory device 9207. If memory card 9331 has one or more electrical contacts, an electric circuit on a circuit board may electrically contact with memory card 9331 when inserted in slot 9302. In case memory card 9331 is contactless, an electric circuit on a circuit board may communicate with memory card 9331 in a radio-frequency manner.

If a boosting scheme as described above is implemented in the digital still camera of FIG. 12, and particularly in memory card 9331, performance may be improved in a read operation, thereby improving reliability of the digital still camera.

Figure 13:
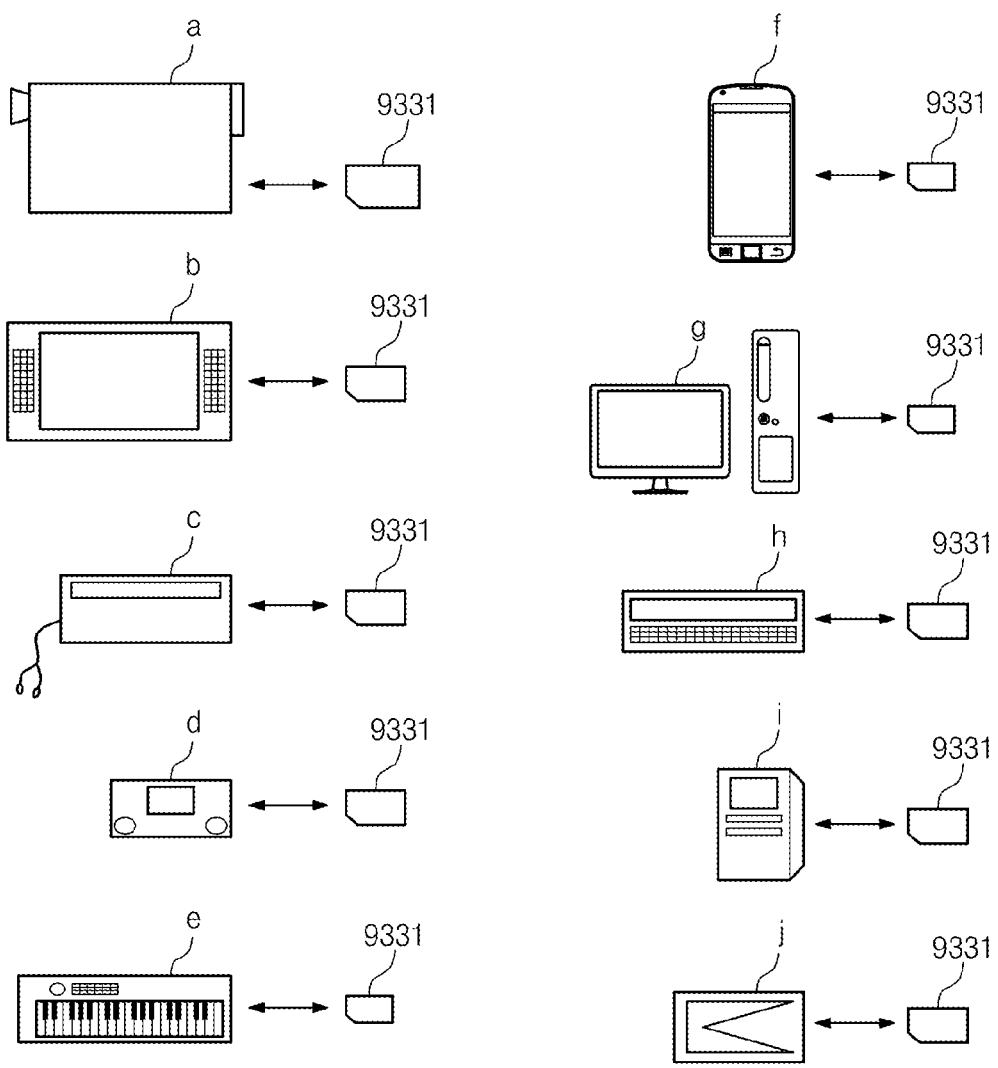
FIG. 13 is a diagram illustrating various systems to which a memory card as illustrated in FIG. 12 may be applied.

FIG. 13 is a diagram illustrating various systems to which memory card 9331 as illustrated in FIG. 12 may be applied.

Referring to FIG. 13, memory card 9331 may be applied to (a) a video camera VC, (b) a television, (c) an audio device, (d) a game machine, (e) an electronic music device, (f) a cellular phone, (g) a computer, (h) a Personal Digital Assistant, (i) a voice recorder, (j) a PC card, and so on.

Each of systems shown in FIG. 13 include a memory card in which a strobe signal is shaped according to a boosting scheme as described above, which may thereby improve operating performance.

Figure 14:
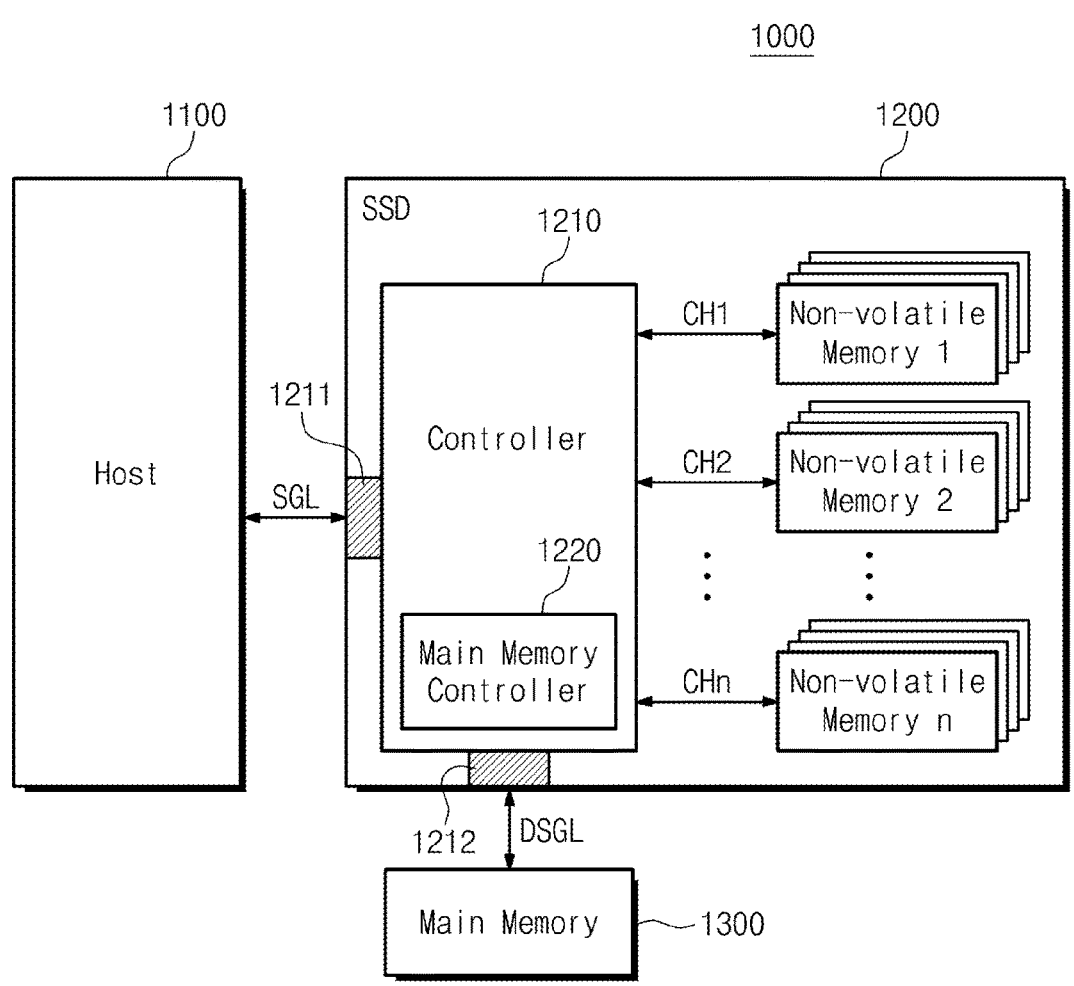
FIG. 14 is a block diagram illustrating an SSD system.

FIG. 14 is a block diagram illustrating a solid state drive (SSD) system 1000.

Referring to FIG. 14, SSD system 1000 comprises a host 1100 and an SSD 1200.

SSD 1200 exchanges signals SGL with host 1100 through a host signal connector 1211, and SSD 1200 exchanges signals with a main memory 1300 via a memory signal connector 1212. SSD 1200 comprises a plurality of nonvolatile memory devices, an SSD controller 1210, and a main memory controller 1220.

For example, main memory controller 1220 may be included in an SSD controller 1210. The nonvolatile memory devices may be used as storage medium of SSD 1200. The nonvolatile memory devices may be implemented with a flash memory device having a mass storage capacity. SSD 1200 mainly uses a flash memory, but it may use nonvolatile memory devices such as PRAM, MRAM, ReRAM, FRAM, and so on.

The nonvolatile memory devices are connected to SSD controller 1210 through a plurality of channels CH1 to CHn. One channel may be connected to one or more memory devices. Memory devices connected to one channel may be connected to the same data bus.

SSD controller 2210 exchanges signals SGL with host 1100 through host signal connector 1211. Main memory controller 1220 exchanges data signals DSGL with main memory 1300 via memory signal connector 1212. Herein, the signals SGL may include a command, an address, data, and so on.

Main memory 1300 may be formed of a DRAM. But, in some cases, main memory 1300 may be formed of a nonvolatile memory device such as a magnetic RAM (MRAM). The MRAM retains data stored therein even at power-off. In case data must be retained even at power-off, a nonvolatile memory device may be preferred to store data. In particular, in case main memory 1300 is implemented with STT-MRAM (Spin transfer torque magneto resistive random access memory), it may have advantages of both the DRAM and the MRAM.

An STT-MRAM cell may include a Magnetic Tunnel Junction (MTJ) element and a selection transistor. The MTJ element may contain a fixed layer, a free layer, and a tunnel layer interposed between the fixed layer and the free layer. A magnetization direction of the fixed layer is fastened, and a magnetization direction of the free layer is equal or opposite to that of the fixed layer according to a condition.

A chip of main memory 1300 or a chip of host 1100 may be packaged according to any of a variety of different packaging technologies. Examples of such packaging technologies may include Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

SSD 1200 in FIG. 14 may correspond to a data storage system as shown and described above with respect to FIG. 1 or 2. Thus, performance of a read operation of SSD 1200 may be improved by shaping a strobe signal, as described above.

FIG. 14 has been described as being an SSD. However, in other embodiments the SSD in FIG. 14 may be used as an eMMC.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

For example, there is described an example in which a first clock edge portion of a strobe signal is forcibly boosted. In some cases, changes or modification on a boosting scheme may be made by changing circuit components of drawings or adding or subtracting components without departing from the spirit and scope of the inventive concept. Also, write leveling of the inventive concept is mainly described using a memory system including a flash memory. However, the inventive concept is applicable to, but not limited to, a data processing system including a semiconductor memory device different from the flash memory.

What is claimed is:

1. A strobe signal shaping method for a data storage system, the method comprising:
    receiving at a memory device a strobe signal;
    when the strobe signal is received after having been paused for more than a predetermined time period, boosting a first clock edge portion of the strobe signal which is received after the predetermined time period wherein the strobe signal was paused; and
    subsequent to boosting the first edge portion of the strobe signal, returning to an operating mode in which a second clock edge portion of the strobe signal which follows the first edge portion of the strobe signal is not boosted,
    wherein the strobe signal is used as a source signal for generating a read enable clock of the memory device.

2. The strobe signal shaping method of claim 1, wherein the first clock edge portion of the strobe signal is boosted by lowering a common-mode voltage level of an output node of a buffer to be less than a common-mode voltage level in the operating mode in which the second clock edge portion of the strobe signal which follows the first edge portion of the strobe signal is not boosted.

3. The strobe signal shaping method of claim 1, wherein boosting the first clock edge portion of the strobe signal increases the duty cycle of the first clock edge portion to more than 50%.

4. The strobe signal shaping method of claim 1, wherein returning to the operating mode in which the second clock edge portion of the strobe signal which follows the first edge portion of the strobe signal is not boosted is accomplished by increasing a common-mode voltage level of an output node of a buffer above a common-mode voltage level during the boosting.

5. The strobe signal shaping method of claim 4, wherein the buffer is an input buffer of the memory device.

6. The strobe signal shaping method of claim 5, wherein the memory device is a flash memory device.

7. The strobe signal shaping method of claim 6, wherein the flash memory device is a multi-stage stack type flash memory device.

8. The strobe signal shaping method of claim 7, wherein the flash memory device is included in a solid state drive.

9. The strobe signal shaping method of claim 7, wherein the flash memory device is included in an embedded MultiMediaCard.

10. The strobe signal shaping method of claim 1, wherein the strobe signal is received from a memory controller in a data read mode of operation.

11. A strobe signal shaping circuit for a data storage system, the circuit comprising:
    a buffer adapted to receive a strobe signal; and
    a boosting circuit,
    wherein if the strobe signal is received after having been paused for more than a predetermined time period, then in response to a boosting enable signal the boosting circuit boosts a first clock edge portion of the strobe signal which is received after the predetermined time period wherein the strobe signal was paused, and turns off boosting for a second clock edge portion of the strobe signal which follows the first clock edge portion,
    wherein the boosting circuit generates a read enable clock of a nonvolatile semiconductor memory device using the strobe signal.

12. The strobe signal shaping circuit of claim 11, wherein when boosting the first clock edge portion of the strobe signal the boosting circuit makes a common-mode voltage level of an output node of the buffer to be less than a common-mode voltage level when not boosting the second clock edge portion of the strobe signal.

13. The strobe signal shaping circuit of claim 12, wherein when boosting the first clock edge portion of the strobe signal the boosting circuit makes a common-mode voltage level of an output node of the buffer to be less than a common-mode voltage level when not boosting the second clock edge portion of the strobe signal such that a duty ratio of the first clock edge portion of the strobe signal exceeds 50%.

14. The strobe signal shaping method of claim 1, wherein boosting a first clock edge portion of the strobe signal includes extending a time length of a first portion of the received strobe signal, wherein the first portion of the received strobe signal extends from a first clock edge of the strobe signal which is received after the idle period to an immediately subsequent clock edge of the received strobe signal.

15. The strobe signal shaping method of claim 14, further comprising not extending a time length of a corresponding second portion of the received strobe signal, wherein the second portion of the received strobe signal extends from a second clock edge of the strobe signal which is received after the first clock edge of the strobe signal to a next clock edge of the received strobe signal which is received after the second clock edge.

16. The strobe signal shaping method of claim 14, wherein the second clock edge of the received strobe signal is the immediately subsequent clock edge of the strobe signal which follows the first clock edge.

17. The strobe signal shaping method of claim 14, wherein the second clock edge of the received strobe signal is a clock edge which is received after the immediately subsequent clock edge of the strobe signal which follows the first clock edge.

18. The strobe signal shaping method of claim 14, wherein a ratio of the time length of the first portion of the received strobe signal to the time length of the second portion of the received strobe signal is less than 50:50, and a ratio of a time length of the first portion of the read enable clock to a time length of the second portion of the read enable clock is at least 50:50.

\* \* \* \* \*